United States Patent
Eisner et al.

(10) Patent No.: US 7,453,074 B2
(45) Date of Patent: Nov. 18, 2008

(54) ION IMPLANTER WITH IONIZATION CHAMBER ELECTRODE DESIGN

(75) Inventors: Edward C. Eisner, Lexington, MA (US); William DiVergilio, Brookline, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 360 days.

(21) Appl. No.: 11/294,975

(22) Filed: Dec. 6, 2005

(65) Prior Publication Data

US 2007/0125965 A1 Jun. 7, 2007

(51) Int. Cl.
*G21K 5/10* (2006.01)
*H01J 37/08* (2006.01)

(52) U.S. Cl. ............... 250/492.21; 250/492.2; 250/492.1; 250/492.3; 250/492.24; 250/423 R; 250/397; 250/281; 250/282; 250/396 R; 250/306; 315/111.41; 315/111.81

(58) Field of Classification Search ............. 250/492.2, 250/492.1, 492.21, 492.3, 492.24, 423 R, 250/397, 281, 282, 396 R, 306; 315/111.41, 315/111.81
See application file for complete search history.

(56) References Cited

U.S. PATENT DOCUMENTS

| 5,026,997 A | 6/1991 | Benveniste |
| 6,559,454 B1 | 5/2003 | Murrell et al. |
| 2003/0146707 A1* | 8/2003 | Goldberg et al. ....... 315/111.81 |

FOREIGN PATENT DOCUMENTS

EP 1538655 6/2005

OTHER PUBLICATIONS

Int. Search Report.

* cited by examiner

*Primary Examiner*—Jack I. Berman
*Assistant Examiner*—Meenakshi S Sahu
(74) *Attorney, Agent, or Firm*—Tarolli, Sundheim, Covell & Tummino LLP

(57) ABSTRACT

An ion implanter includes an ion source for generating an ion beam moving along a beam line and a vacuum or implantation chamber wherein a workpiece, such as a silicon wafer is positioned to intersect the ion beam for ion implantation of a surface of the workpiece by the ion beam. An ion source includes a ionization chamber and an ionization chamber electrode defining an ionization chamber aperture, wherein the ionization chamber electrode includes a raised portion for generating substantially uniform electric fields in the region adjacent the ionization chamber electrode.

26 Claims, 5 Drawing Sheets

ION IMPLANTER WITH IONIZATION CHAMBER ELECTRODE DESIGN

FIELD OF THE INVENTION

The present invention concerns systems for ion implantation typically utilized in the manufacture of semiconductor wafers and other workpieces and, more particularly, the beam extraction system of an ion implanter.

BACKGROUND ART

Axcelis Technologies, assignee of the present invention, designs and sells products for treatment of workpieces such as silicon wafers during integrated circuit fabrication. Ion implanters create an ion beam that modifies the physical properties of workpieces such as silicon wafers that are placed into the ion beam. This process can be used, for example, to dope the silicon from which the untreated wafer is made to change the properties of the semiconductor material. Controlled use of masking with resist materials prior to ion implantation as well as layering of different dopant patterns within the wafer produce an integrated circuit for use in one of a myriad of applications.

Ion implanters typically include an ion source including an ionization chamber for ionizing a neutral gas from gaseous feed material or from vapor generated from a solid or liquid feed material to produce a collection of charged particles i.e. ions and electrons, hereinafter referred to as a plasma. Ions are extracted from the ion source plasma by creating an electric field between the source plasma ions and an electrode, or a series of electrodes, to form an ion beam. The beam travels through specially shaped apertures in each of the electrodes. Typical beam extraction systems are either 3 or 4 electrode systems, although other variations are possible, including very extended systems where final beam deceleration is accomplished in the proximity of the wafer. A standard three electrode system typically comprises a first electrode, the so-called plasma electrode, or arc slit electrode, or ionization chamber electrode, which may be electrically biased at the same large positive voltage as the ion source. This potential determines the beam energy. A second electrode, the so-called suppression electrode, is at a moderate negative voltage to prevent electrons from streaming back to the source chamber. A third and final electrode, the so-called ground electrode, is at ground potential. The extracting electric field is determined by the potential difference between the ionization chamber electrode and the suppression electrode, the details of their shapes, and the distance therebetween. In many ion implantation processes, it is necessary to generate beams of very different energies and different species for different doping properties, for example 5 kV boron for source-drain extensions and 80 kV arsenic for punchthrough stop. The strength of the electric fields generated by the electrodes must be tuned and adjusted to match the desired extracted beam current and maintain good ion beam optics. This process is called perveance matching. One of the most common methods for achieving good perveance matching is to move the suppression and ground electrodes relative to the ion source, more specifically, the ionization chamber electrode. The distance between the ionization chamber electrode, which defines the ionization chamber aperature, and the suppression electrode, which defines the suppression aperture, is called the extraction gap.

Advanced integrated chip manufacturing methods have brought to light various issues involving the implantation of ions at low energies. Transporting low energy ion beams is problematic because space charges within the ion beam cause the beam profile to diverge, commonly known as beam blow up. Beam blow up results in beam current loss and degradation of beam emittance. One solution that has been proposed to solve the problems associated with low energy ion implantation is molecular-ion beam implantation, wherein ionized molecules of ions are transported and implanted into a work piece as opposed to the implantation of atomic species. However, extraction of molecular ion beams require large extraction gaps as compared to more typical high current ion implantation systems. When the gap is large, as for example, comparable in size to the extraction electrodes and/or to the distance from the ionization aperture to the surrounding ground, the electric field lines tend to bend in undesirable ways that cause the beam to over or under focus and result in a loss of beam current due to clipping on apertures further down the beam line. These optics problems are exacerbated by the relative geometric length of the apertures. Due to the length of the apertures relative to other scale lengths, electric fields can become non-uniform over the length of the apertures. These focusing problems are more acute when the long dimension of the aperture is in the dispersive plane of the ion beam, such as can be found in so-called parallel to point optics systems utilized in some ion implanters.

SUMMARY OF THE INVENTION

The addition of a rim or a raised barrier, at some distance from the edge of the plasma or ionization aperture, can greatly improve the uniformity of the electric field adjacent thereto, as well as through the gap between the ionization and the suppression electrodes. In particular, the advantageous effect on electric field uniformity can be demonstrated for a large range of gaps. In addition, the overall sizes of the electrodes are made as large as possible. The physical dimensions of the rim, and the distance of the rim from the edge of the ionization aperture are determining factors in the range of gaps, and the central gap, over which the system is tuned. Adding curvature to any or all of the electrodes will also help tune the desired gap, although curvature generally will not help extend the range of gaps.

The present invention provides an ion implantation system comprising, among other things, an ion source for generating an ion beam, wherein the ion source includes an ionization chamber having an ionization chamber electrode defining an ionization chamber aperture for permitting ions to exit the ionization chamber. In particular, the ionization chamber electrode defines an elongated aperture with a rim spaced therefrom extending in a direction of ion movement away from the ionization chamber. The rim can be provided as integral to or additional and separate from the ionization chamber electrode. In another embodiment, the ionization chamber electrode provides extraction of ions from the ionization chamber through the ionization chamber aperture, the ionization chamber electrode being characterized by a raised face portion bounding and spaced from the aperture along a plane spaced from a first surface bordering the aperture in a direction of ion movement away from said arc chamber, and including raised portions bounding the aperture at opposite ends thereof along a plane intermediate the first surface bordering the aperture and the raised face portion.

These and other features of the exemplary embodiment of the invention are described in detail in conjunction with the accompanying drawings.

EXEMPLARY MODE FOR PRACTICING THE INVENTION

Figure 1:
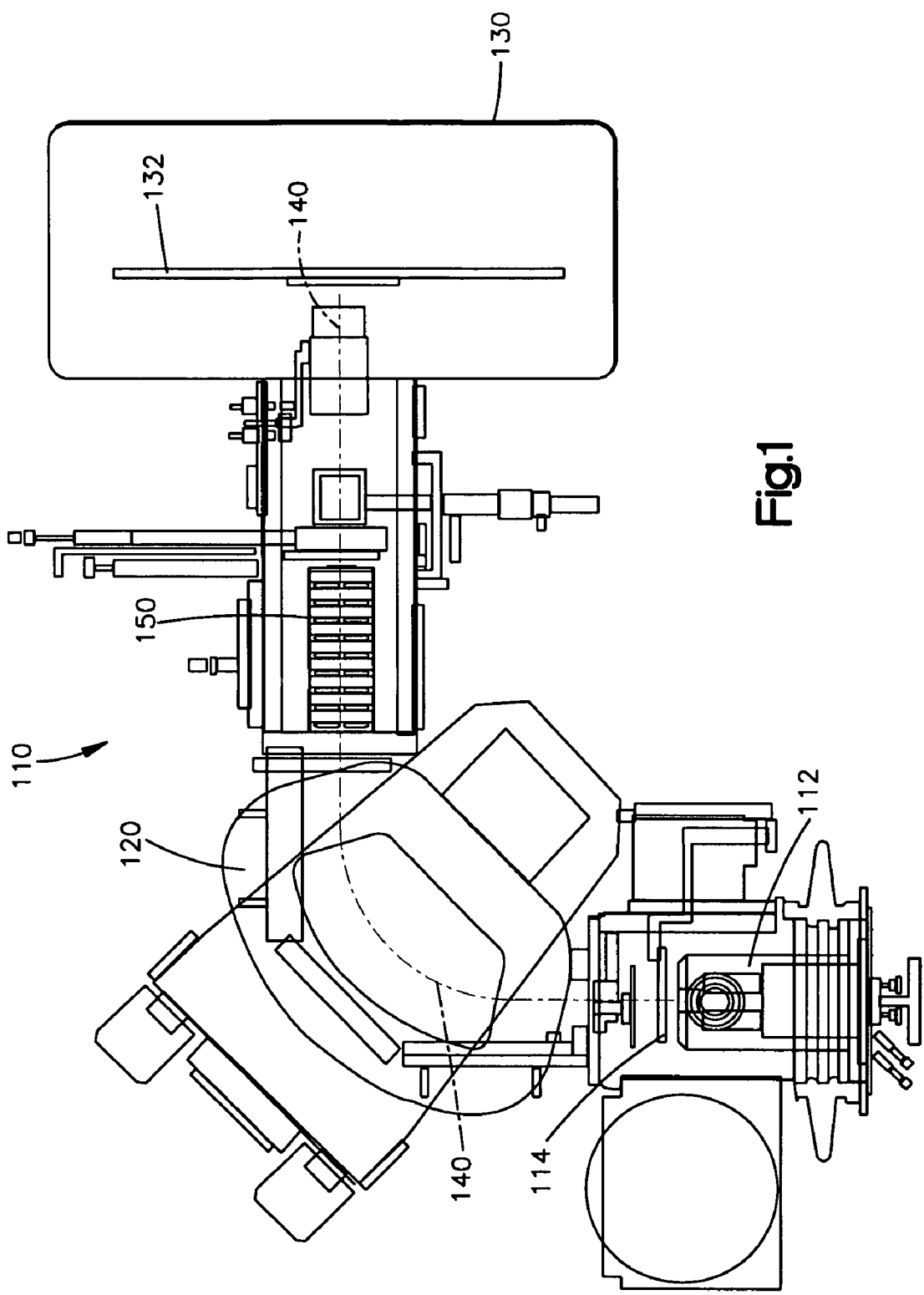
FIG. 1 is a schematic plan view of an exemplary ion implantation system.

Turning to the drawings, FIG. 1 illustrates a schematic depiction of an ion implanter 110. The implanter includes an ion source 112 for creating ions that form an ion beam which is shaped and selectively deflected to traverse a beam path to an end or implantation station 130. The implantation station includes a vacuum or implantation chamber defining an interior region in which a workpiece such as a semiconductor wafer is positioned by a support 132 for implantation by ions that make up an ion beam originating at the source 112. Control electronics are provided for monitoring and controlling the ion dosage received by the workpiece. Operator input to the control electronics are performed via a user control console, typically located near the implantation station 130. To reduce ion beam loss due to collisions with neutral particles, the region between the source and the implantation chamber is maintained at low pressure by one or more vacuum pumps.

The ion source 112 includes an ionization or plasma chamber defining an interior region into which source materials are injected. The source materials may include an gaseous feed material or vaporized solid or liquid source material. Ions generated within the ionization chamber are extracted from the chamber by an ion beam extraction assembly 114 which may include a number of electrodes for creating an ion accelerating electric field. Ion sources are well known in the field of ion implantation, as illustrated, for example by U.S. Pat. Nos. 5,026,997; 5,661,308; 6,107,634, and 6,452,338, as well as the references cited therein. The disclosure of these patents and the references cited therein are hereby incorporated herein, in their entirety.

Downstream from the beam extraction assembly 114, a mass analysis magnet 120 bends ions of the proper charge-to-mass ratio along trajectories so that only a desired ion species of a beam 140 enter the ion implantation chamber 130.

Figure 3:
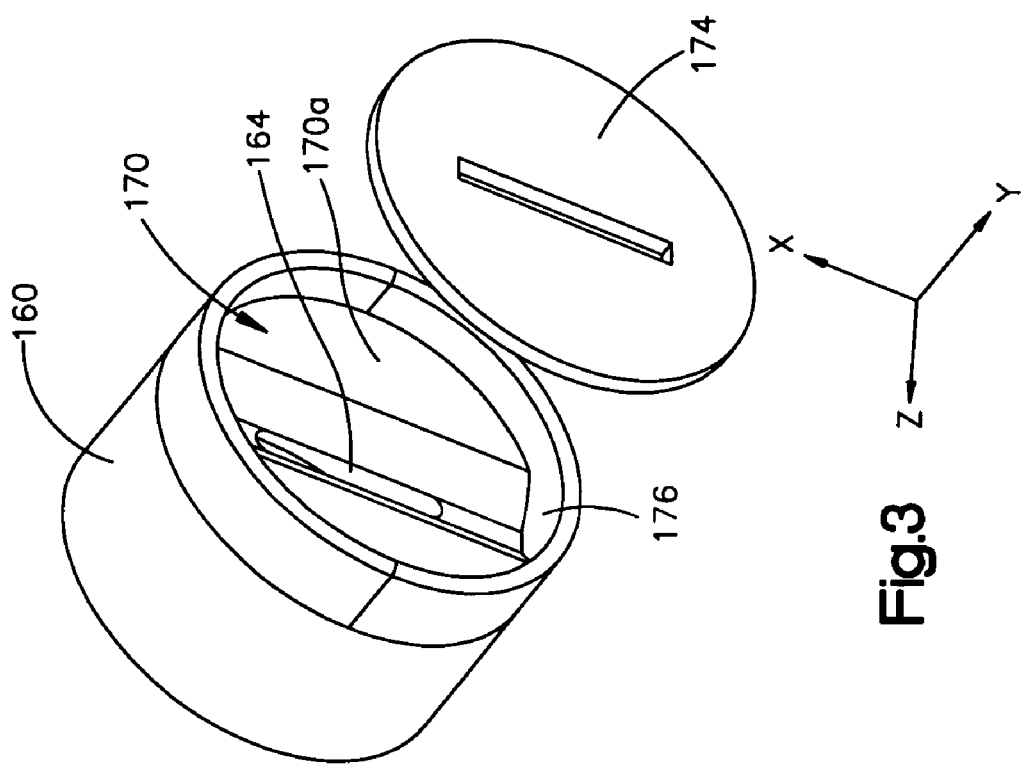
FIGS. 3 and 4 are perspective views of two alternate embodiments of ionization chamber electrodes constructed in accordance with the present invention.
Figure 2:
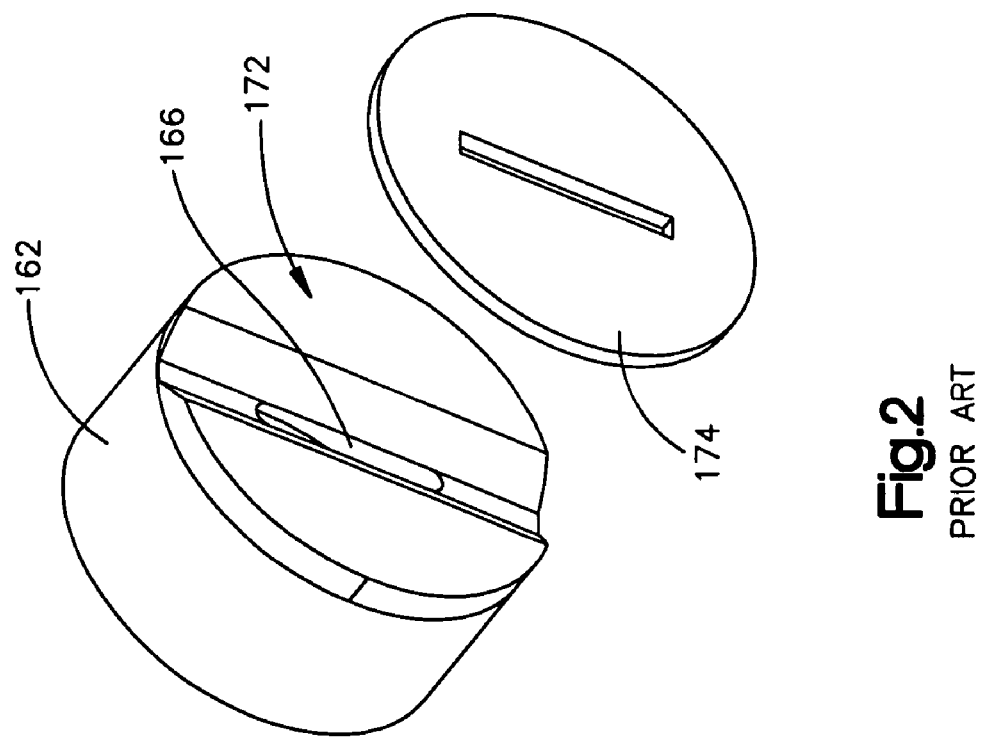
FIG. 2 is a perspective view of an ionization chamber electrode typical of the prior art.
Figure 4:
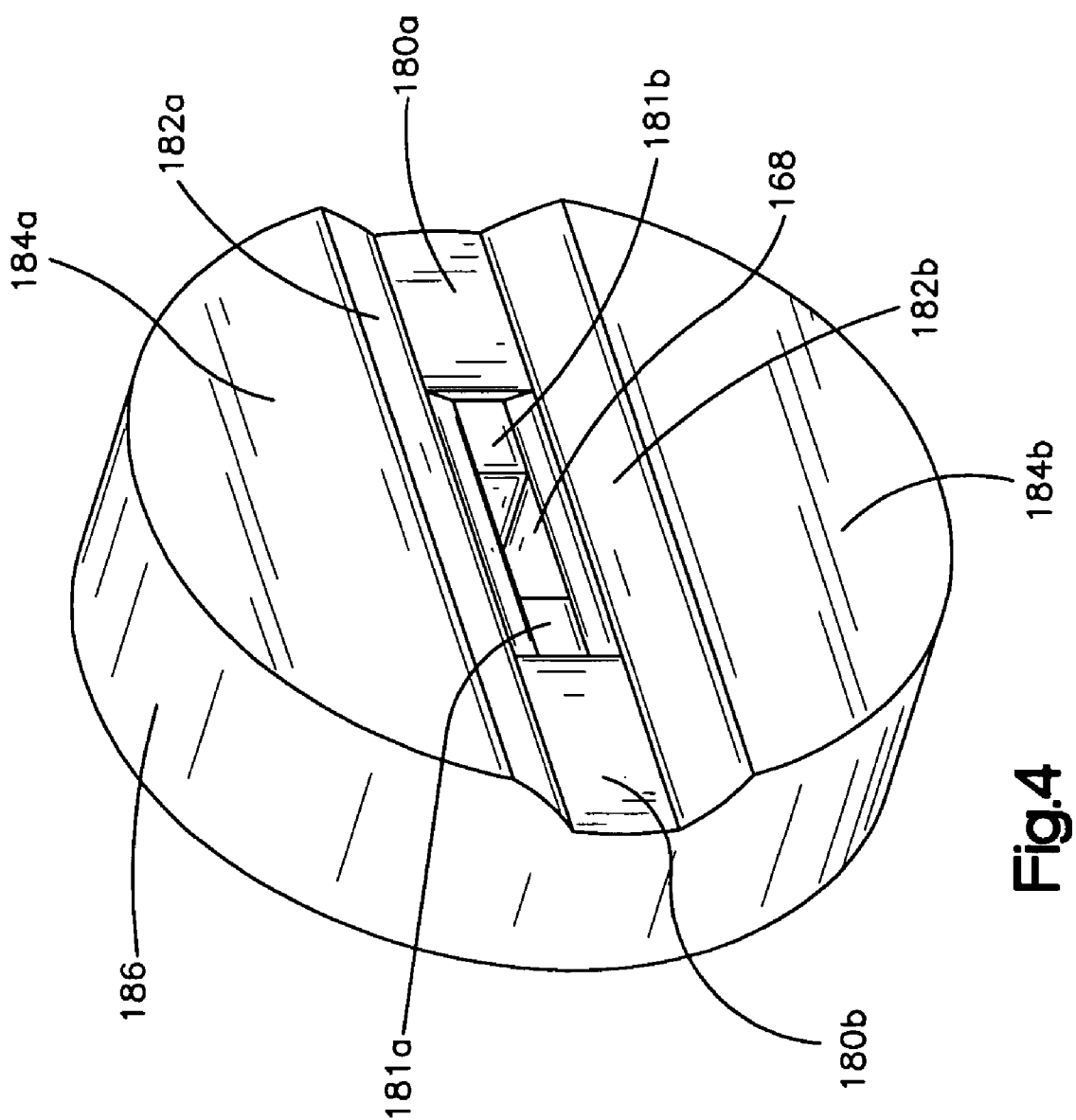

FIGS. 2, 3, and 4 depict ion sources having various ionization chamber electrode designs for creating a uniform electric field in the vicinity of the source. The ionization chambers 160, 162 include their respective ionizations chamber electrodes 170, 172 and 186, wherein ions are extracted from the source ionization chamber 160, 162 and pass through the respective ionization chamber apertures 164, 166 and 168. The ionization chamber electrode may either be an integral part of the ion source or one or more separate pieces mounted and situated near or against the ion source. As ions exit their respective chambers they accelerate toward an appropriately biased second electrode 174, or so-called suppression electrode.

Figure 5:
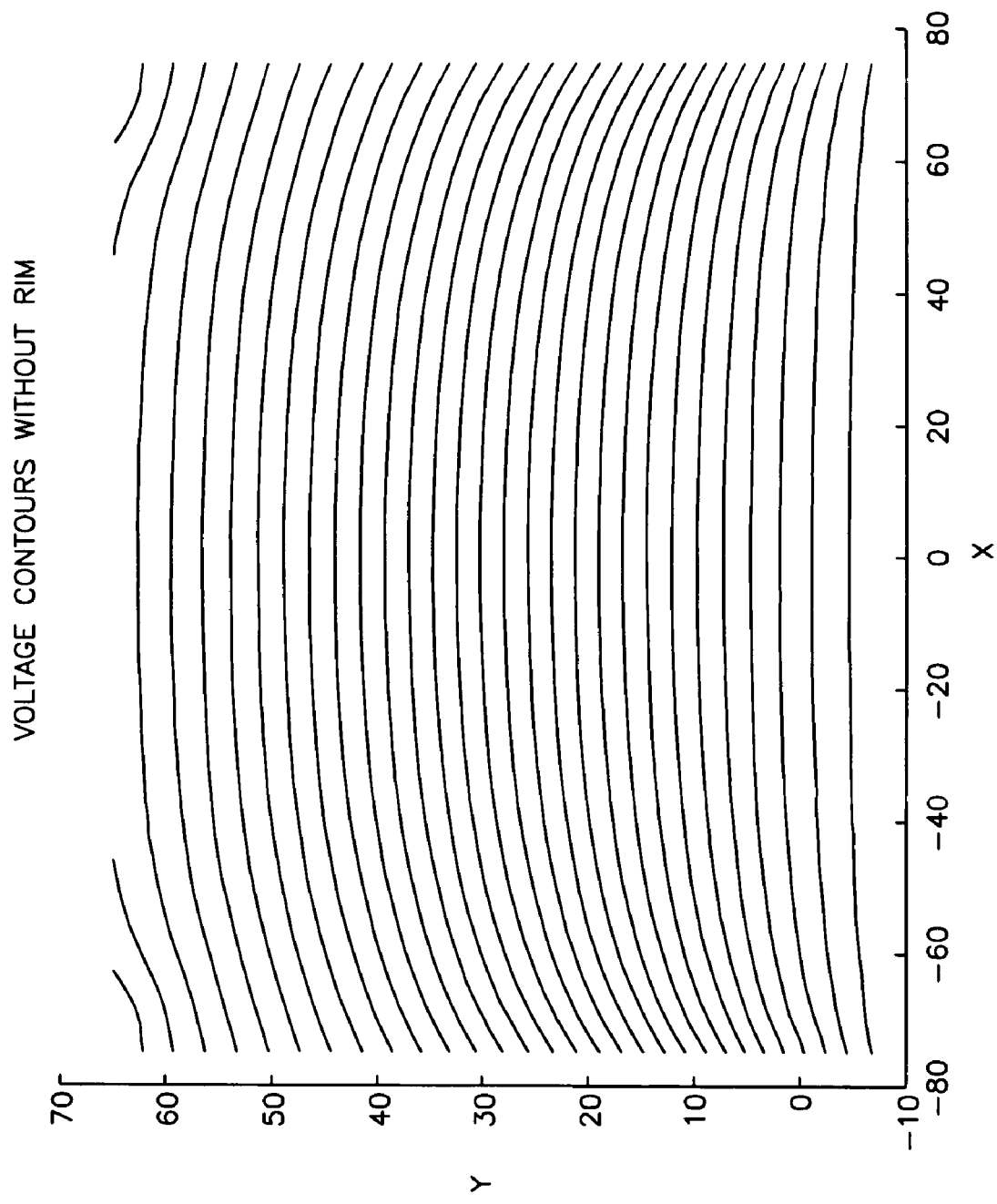
FIGS. 5 and 6 provide a graphic representations of electrostatic equiptoential plots showing field uniformity in a region of the gap between the ionization chamber electrode for the cases represented in FIGS. 2 and 3.

FIG. 2 depicts an ionization electrode 172 typical of the prior art. FIG. 5 represents an electrostatic equipotential plot showing the electrostatic potentials in the region between the ionization chamber electrode 172 and the suppression electrode 174 for the electrode configuration of FIG. 2. The ordinate, Y, represents the gap direction while the abscissa, X, represents the direction along the axis or long dimension of the aperture. At any point in space, the force on an ion is in the direction of the electric field, which is perpendicular to equipotential lines. Examining FIG. 5, it is seen that the curvature of the equipotentials indicates that the force on an ion at positive values of X has a component in the positive X direction, while the force on an ion at negative values of X has a component in the negative X direction. Thus, this geometry leads to divergence of the ion beam in the X direction.

The ion source shown in FIG. 3 has a ionization chamber electrode 170 defining an elongated aperture 164 for allowing ions within source ionization chamber 160 to exit the source chamber and accelerate through a region in close proximity to the ionization and suppresssion electrodes As shown in FIG. 3, and in accordance with the present invention, the source ionization electrode 170 includes a raised rim 176 spaced from the ionization electrode aperture 164 that extends away from a flat surface, or face, 170a of the ionization chamber electrode, in a direction of ion movement away from the source. While the rim 176 is shown to be circular in plan, it will be understood that the rim could be rectangular or any other geometric shape in plan. The rim 176 may completely circumscribe the aperture or may be comprised of at least two parts positioned on opposing sides of the aperture. In addition, the rim 176 may be provided as an additional, separate rim that may be mounted on or spaced from the face 170a of the electrode, extending in a direction of ion movement away from the ionization chamber. It will be appreciated that in such a configuration the additional rim may be mounted in a manner so as to permit selective positioning of the rim relative to the electrode face such that the perpendicular distance of the rim from a surface bordering the aperture may be varied.

Figure 6:
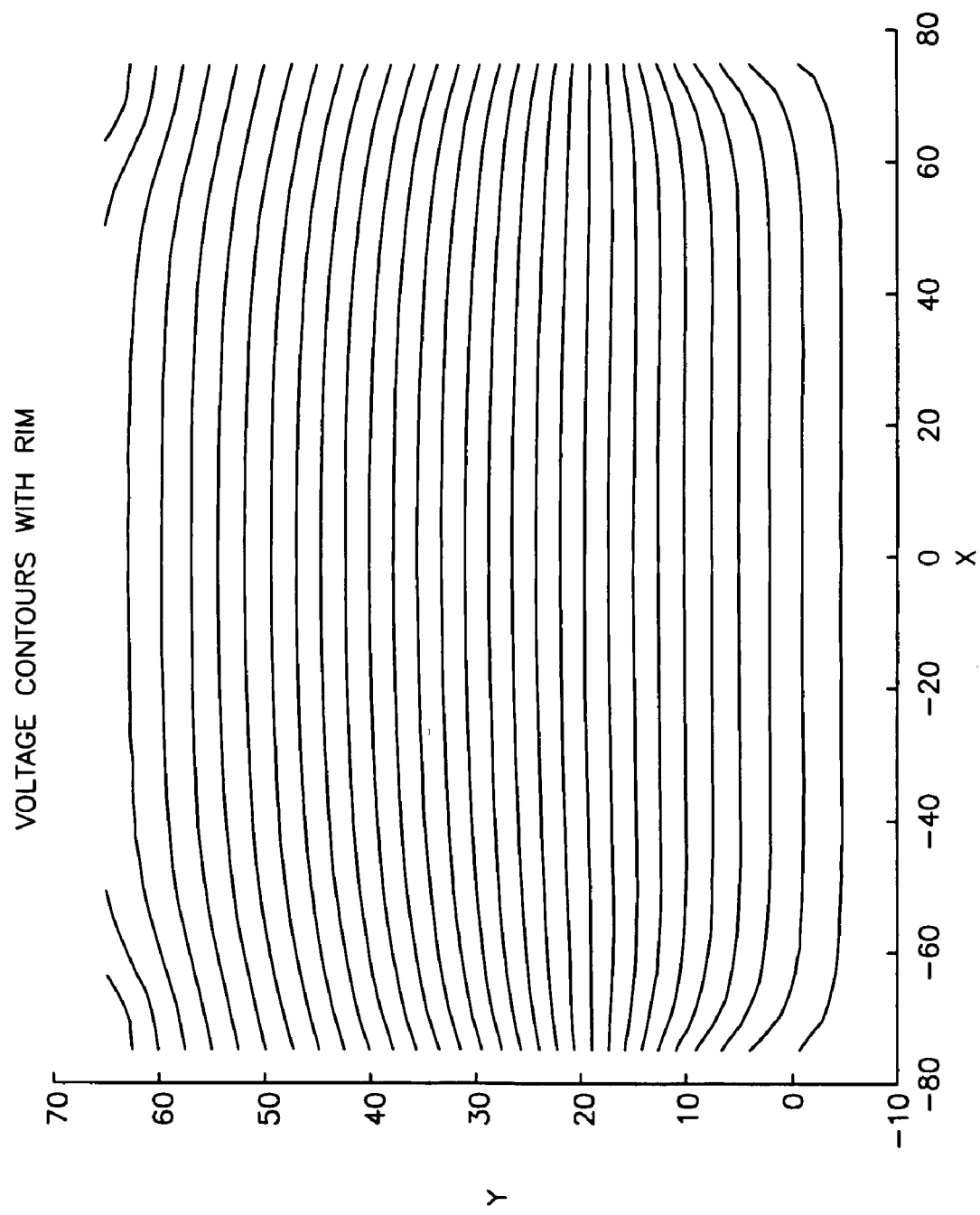

FIG. 6 shows a contour plot of the electrostatic potential in the region between the ionization chamber electrode 170 and the suppression electrode 174 for the geometry of the rimmed electrode shown in FIG. 3. In comparison to the contour plot of FIG. 5, the curvature of the equipotentials has been reduced, which leads to a reduction in ion beam divergence. While the ionization chamber electrode of present invention may have various dimensions as prescribed by various factors, a preferred embodiment of the plasma or ionization chamber electrode of FIG. 3 that resulted in the data provided in FIG. 6 has a length of 50 mm and the rim 176 has a height of 30 mm. The gap was 60 mm Turning to FIG. 4, there is depicted an ion source electrode in accordance with a second embodiment of the present invention, wherein the electrode includes a plate defining an elongated aperture 168 for allowing ions within the ion source to exit the source and accelerate through a region in close proximity to the ionization chamber electrode. The ionization chamber electrode of this embodiment includes generally flat surfaces 181a, 181b situated immediately adjacent to and in the same plane as the aperture, and further includes raised portions 180a, 180b bounding the aperture and adjacent flat surfaces and spaced on either side thereof. In the illustrated embodiment the aperture is an elongated slit having a long axis extending between opposite ends thereof, wherein the aperture is bounded at these opposite ends by the generally flat surfaces 181a, 181b, situated immediately adjacent to the aperture, and the raised portions 180a, 180b, adjacent the generally flat surfaces 181a, 181b... Beveled surfaces 182a, 182b may also be provided adjacent the elongated slit and extending between the opposite ends thereof to create a generally sloped surface extending along the sides of the elongated slit to the generally flat surfaces 184a, 184b of the face of the electrode, which is at a raised elevation relative to the aperture, as well as the forwardmost surface of the defined raised portions 180a, 180b. As such, the electrode of the present invention as illustrated in the embodiment of FIG. 4 may include a raised face portion bounding and spaced from the elongated aperture in a plane spaced from a first surface bordering the aperture in a direction of ion movement, as well as raised portions bounding the aperture at opposite ends thereof in a plane intermediate the first surface bordering the aperture and the raised face portion. The ionization chamber electrode may further include beveled surfaces 182a and 182b adjacent the elongated slit for creating a generally sloped surface extending from the aperture to the raised face portion. As illustrated, the beveled surfaces 182a and 182b may further be partitioned to provide a first slope immediately adjacent the aperture, and a second slope extending form the intermediate plane to the face plane.

While the present invention has been described with a degree of particularity, it is the intent that the invention includes all modifications and alterations from the disclosed design falling with the spirit or scope of the appended claims.

We claim:
1. An ion implanter comprising:
 a) an ion source including an ionization chamber having an interior region for generating ions for use in creating an ion beam confined to a beam path;
 b) an implantation chamber having an evacuated interior region wherein a workpiece is positioned to intersect the ion beam;
 c) structure for accelerating and shaping the ion beam from the source to move along the beam path between the ion source and the implantation chamber; and
 d) an ionization chamber electrode having a front defining an elongated aperture for allowing ions to exit said ionization chamber and accelerate through a region in close proximity to said ionization chamber electrode including a rim having an outwardly facing rim surface spaced from the aperture, a flat border surface immediately adjacent the aperture in a plane closer to the interior region of the ionization chamber than the outwardly facing rim surface; and an intermediate transition surface between the border surface and the outwardly facing rim surface.

2. The ion implanter of claim 1 wherein the rim completely circumscribes the ionization chamber aperture at some distance therefrom.

3. The ion implanter of claim 1 wherein the rim partially circumscribes the ionization chamber aperture at some distance therefrom.

4. The ion implanter of claim 2 wherein the rim is circular in plan.

5. The ion implanter of claim 2 wherein the rim is rectangular in plan.

6. The ion implanter of claim 1 wherein the intermediate transition surface comprises a sloped planar surface.

7. An ion implanter comprising:
 a) an ion source for generating an ion beam confined to a beam path;
 b) an implantation chamber having an evacuated interior region wherein a workpiece is positioned to intersect the ion beam;
 c) structure for accelerating and shaping the ion beam from the source to move along the beam path between the ion source and the implantation chamber; and
 d) an ionization chamber electrode having an elongated aperture for allowing ions within the ionization chamber to exit said ionization chamber and accelerate through a region in close proximity to said ionization chamber electrode;
 e) said electrode having a front defined by a flat border surface immediately adjacent the elongated aperture and a generally planar raised face portion spaced from the elongated aperture and the flat surface immediately adjacent said aperture by a transition boundary.

8. The ion implanter of claim 1 wherein the additional rim is mounted to said electrode in a movable manner such that the perpendicular distance of the rim from a surface bordering the aperture is variable.

9. The ion implanter of claim 1 wherein the additional rim is comprised of two parts, one on each side of the ionization chamber aperture.

10. An ion implanter comprising:
 a) an ion source for generating an ion beam confined to a beam path;
 b) an implantation chamber having an evacuated interior region wherein a workpiece is positioned to intersect the ion beam; and
 c) structure for accelerating and shaping the ion beam from the source to move along the beam path between the ion source and the implantation chamber;
 d) said ion source including an ionization chamber and an ionization chamber electrode defining an elongated aperture for allowing ions within said source to exit said source and accelerate through a region in close proximity to said ionization chamber electrode and including a raised rim portion bounding the aperture having an outward face spaced from the aperture above a first planar, immediately adjacent surface bordering the aperture.

11. An ion source comprising:
 an ionization chamber having an interior region for generating ions; and
 an ionization chamber electrode having a front defining an elongated aperture for allowing ions to exit said ionization chamber and accelerate through a region in close proximity to said ionization chamber electrode including a rim having an outwardly facing rim surface spaced from the aperture, a flat border surface immediately adjacent the aperture in a plane closer to the interior region of the ionization chamber than the outwardly facing rim surface; and an intermediate transition surface between the bounding surface and the outwardly facing rim surface.

12. The ion source of claim 11, wherein the rim completely circumscribes the aperture at some distance therefrom.

13. The ion source of claim 11, wherein the rim partially circumscribes the aperture at some distance therefrom.

14. The ion source of claim 11 wherein the rim of said electrode is circular in plan.

15. The ion source of claim 11 wherein the rim of said electrode is rectangular in plan.

16. The ion source of claim 11 wherein the rim of said electrode comprises one or more straight segments, either parallel or perpendicular to a long axis of the extraction aperture.

17. The ion source of claim 11, wherein the additional rim is mounted in a manner so as to permit selective positioning thereof such that a perpendicular distance of the rim from a surface bordering the aperture is adjustable.

18. The ion source of claim 11 wherein the additional rim is comprised of at least two parts positioned on opposite sides of the aperture.

19. The ion source of claim 11 wherein the additional rim circumscribes the aperture.

20. An ion source for generating an ion beam, comprising; an ionization chamber for generating ions; and an ionization chamber electrode for extracting ions from said ionization chamber, said electrode defining an elongated aperture and a raised face portion bounding and spaced from the aperture in a plane spaced from a flat, immediately adjacent surface bordering the aperture in a direction of ion movement away from said ionization chamber, and including raised portions bounding the aperture at opposite ends thereof in a plane intermediate the flat surface bordering the aperture and the raised face portion.

21. The ion source of claim 20, wherein said electrode further includes beveled surfaces adjacent the elongated aperture for creating a generally sloped surface extending from the aperture to the raised face portion.

22. An ion source comprising:
an ion chamber for generating a controlled concentration of ions; and
an ionization chamber electrode having an elongated aperture for allowing ions within the ionization chamber to exit said ionization chamber and accelerate through a region in close proximity to said ionization chamber electrode;
said electrode having a front defined by a flat border surface immediately adjacent the elongated aperture and a generally planar raised face portion spaced from the elongated aperture and the flat surface immediately adjacent said aperture by a transition boundary.

23. The ion source of claim 11 wherein the flat border surface immediately adjacent the aperture and the rim surface are in generally parallel spaced apart planes.

24. The ion source of claim 23 wherein the flat border surface abuts opposite ends of said elongated aperture.

25. The ion source of claim 22 wherein the flat surface immediately adjacent the elongated aperture and the generally planar raised face portion are in spaced apart generally parallel planes.

26. The ion source of claim 25 wherein the flat border surface abuts opposite ends of said elongated aperture.

* * * * *